United States Patent
Krebs et al.

(10) Patent No.: US 9,293,199 B2
(45) Date of Patent: Mar. 22, 2016

(54) PHASE-CHANGE MEMORY CELLS

(71) Applicant: GLOBALFOUNDRIES INC., Grand Cayman (KY)

(72) Inventors: Daniel Krebs, Zurich (CH); Abu Sebastian, Adliswil (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/296,507

(22) Filed: Jun. 5, 2014

(65) Prior Publication Data

US 2014/0369113 A1 Dec. 18, 2014

(30) Foreign Application Priority Data

Jun. 14, 2013 (GB) .................................. 1310629.9

(51) Int. Cl.
*G11C 11/00* (2006.01)
*G11C 13/00* (2006.01)
*H01L 45/00* (2006.01)

(52) U.S. Cl.
CPC .......... *G11C 13/0004* (2013.01); *G11C 13/003* (2013.01); *G11C 13/004* (2013.01); *H01L 45/06* (2013.01); *H01L 45/12* (2013.01); *H01L 45/128* (2013.01); *H01L 45/1226* (2013.01); *H01L 45/1233* (2013.01); *H01L 45/144* (2013.01); *H01L 45/16* (2013.01); *H01L 45/1683* (2013.01); *G11C 2213/50* (2013.01)

(58) Field of Classification Search
USPC .......................................................... 365/148
See application file for complete search history.

(56) References Cited

U.S. PATENT DOCUMENTS

| | | | |
|---|---|---|---|
| 7,391,642 B2 | 6/2008 | Gordon et al. | |
| 8,269,208 B2 | 9/2012 | Czubatyj et al. | |
| 2004/0052117 A1 | 3/2004 | Jiang | |
| 2006/0226409 A1 | 10/2006 | Burr et al. | |
| 2010/0283027 A1* | 11/2010 | Hosaka et al. | 257/2 |
| 2011/0155989 A1 | 6/2011 | Park et al. | |
| 2012/0192034 A1 | 7/2012 | Franceschini et al. | |
| 2013/0026436 A1 | 1/2013 | Breitwisch et al. | |

OTHER PUBLICATIONS

Liao et al., "Chalcogenide Phase Change Induced with Single-Wall Carbon Nanotube Heater," IEEE 2009 67th Annual Device Research Conference (DRC 2009), p. 239-240, Jun. 2009.

* cited by examiner

*Primary Examiner* — Anthan Tran
(74) *Attorney, Agent, or Firm* — Scully Scott Murphy and Presser

(57) ABSTRACT

A phase-change memory cell for storing information in a plurality of programmable cell states. The memory cell includes: a phase-change material located between a first electrode and a second electrode for applying a read voltage to the phase-change material to read a programmed cell state; and an electrically-conductive component extending in a direction between the first and second electrodes in contact with the phase-change material and arranged to present, to a cell current produced by the read voltage, a lower-resistance current path than an amorphous phase of the phase-change material in any of the plurality of programmable cell states, said current path having a length dependent on a size of said amorphous phase, wherein a volume of the electrically-conductive component is greater than about half that of said phase-change material.

30 Claims, 8 Drawing Sheets

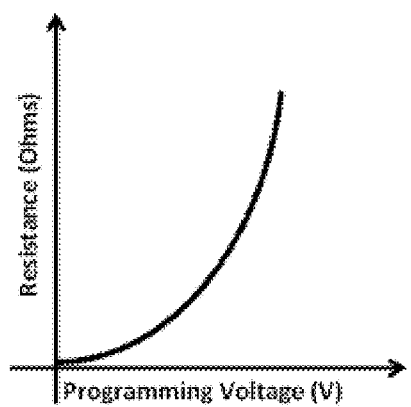
Figure 10
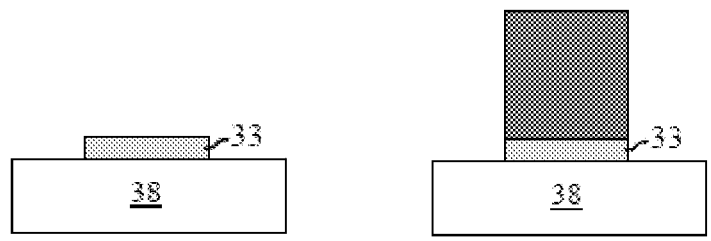
Figure 11a              Figure 11b
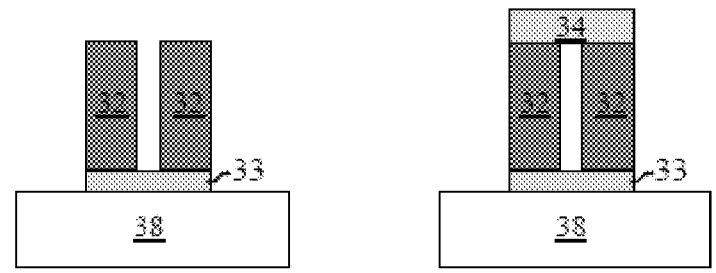
Figure 11c              Figure 11d

PHASE-CHANGE MEMORY CELLS

CROSS-REFERENCE TO RELATED APPLICATION

This application claims priority under 35 U.S.C. §119 from GB Patent Application No. 1310629.9 filed Jun. 14, 2013, the entire contents of which are incorporated herein by reference.

BACKGROUND OF THE INVENTION

1. Field of the Invention

The present invention relates to phase-change memory cells.

2. Description of Related Art

Phase-change memory (PCM) is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

In single-level PCM devices, each cell can be set to one of s=2 states, a "SET" state and a "RESET" state, permitting storage of one bit per cell. In the RESET state, which corresponds to a wholly amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state on rapid cooling. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes current to flow through the cell, this current being dependent on resistance of the cell. Measurement of the cell current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

A problem with phase-change memory is that the resistance of the amorphous phase exhibits undesirable attributes such as low-frequency noise and drift. This drift causes resistance of the amorphous phase to increase in value over time. As a result, the read measurements for programmed cell states tend to vary with time. This complicates read out of the stored information, potentially even destroying the information if there is a large variability in the drift exhibited by different cell states so that the read measurement distributions for neighboring cell states interfere with one another. The larger the number of cell states, and so closer the initial spacing between readback resistance levels, the more susceptible cells are to this problem. This presents a significant challenge in the development of multilevel phase-change memory, frustrating efforts to achieve storage of more bits per cell for increased storage density and so reduce manufacturing cost per bit.

Currently, several methods are used to alleviate problems associated with resistance drift. One class of methods uses specialized read and write schemes for storage and readout of information in the memory. These methods typically incur a penalty in write or read speed, and require more complicated read/write circuitry for the memory cells. Another class of methods makes use of coding to introduce redundancy in the stored information. This inherently reduces storage density. Another approach is disclosed in European Patent Application Publication No. EP 2034536 A1 and illustrated in FIG. 1 of the accompanying drawings. This figure shows a schematic illustration of a PCM cell 1 having a volume of phase-change material 2 located between a top electrode 3 and a bottom electrode (or "heater") 4. The cell state shown represents an intermediate state in which phase-change material 2 contains both crystalline and amorphous phases. The amorphous phase is indicated by the shaded hemispherical volume 5 above bottom electrode 4. Crystalline phase 6 occupies the remainder of the cell volume. A thin resistive region 7 provides a parallel current path between bottom electrode 4 and crystalline phase 6 of the phase-change material in operation. When a read voltage is applied to read the programmed cell-state, the resulting read current flows primarily via this current path from crystalline phase 6 to bottom electrode 4, in preference to flowing through the high-resistance amorphous phase 5. The resistance of the parallel current path depends on the length "x" in the figure.

Various other problems are associated with current PCM cells. For example, since PCM operates via Joule heating-induced phase change, a large RESET current is typically required to restore cells to the RESET state. This has an adverse effect on power consumption. Thermal disturb is another key problem faced by phase-change memory as cell-size is reduced. As the distance between the PCM cells decreases, the phase configuration in a cell can be disturbed by programming an adjacent cell. This presents a significant technological challenge to the future scaling of PCM.

Improvements in phase change memory cells can be highly desirable.

SUMMARY OF THE INVENTION

According to one aspect of the present invention, a phase-change memory cell for storing information in a plurality of programmable cell states is provided. The memory cell includes: a phase-change material located between a first electrode and a second electrode for applying a read voltage to the phase-change material to read a programmed cell state; and an electrically-conductive component extending in a direction between the first and second electrodes in contact with the phase-change material and arranged to present, to a cell current produced by the read voltage, a lower-resistance current path than an amorphous phase of the phase-change material in any of the plurality of programmable cell states, said current path having a length dependent on a size of said amorphous phase, wherein a volume of the electrically-conductive component is greater than about half that of said phase-change material.

According to a second aspect of the present invention, a memory device is provided. The memory device includes: an array of phase-change memory cells having: a phase-change material located between a first electrode and a second electrode for applying a read voltage to the phase-change material to read a programmed cell state; and an electrically-conductive component extending in a direction between the first and second electrodes in contact with the phase-change material and arranged to present, to a cell current produced by the read voltage, a lower-resistance current path than an amorphous phase of the phase-change material in any of the plurality of programmable cell states, said current path having a length dependent on a size of said amorphous phase, wherein a volume of the electrically-conductive component is greater than about half that of said phase-change material; and a read/write controller for reading and writing data in the phase-change memory cells.

According to a third aspect of the present invention, a method for forming a phase-change memory cell for storing information in a plurality of programmable cell states is provided. The method includes: forming a first electrode and a second electrodes having a phase-change material located there between; and forming an electrically-conductive component having a volume which is greater than half that of said phase-change material, wherein said electrically-conductive component extends in a direction between the first and second electrodes in contact with the phase-change material and is arranged to present, to a cell current produced by a read voltage applied via the first and second electrodes to read a programmed cell state in use, a lower-resistance current path than an amorphous phase of the phase-change material in any of said plurality of programmable cell states, said current path having a length dependent on a size of said amorphous phase.

BRIEF DESCRIPTION OF THE DRAWINGS

Embodiments of the invention will now be described, by way of example, with reference to the accompanying drawings.

FIG. 10 shows a programming curve for the FIG. 8 cell, according to an embodiment of the present invention.

FIGS. 11a to 11d illustrates successive stages in fabrication of the FIG. 8 cell, according to an embodiment of the present invention.

DETAILED DESCRIPTION OF THE PREFERRED EMBODIMENTS

Figure 1:
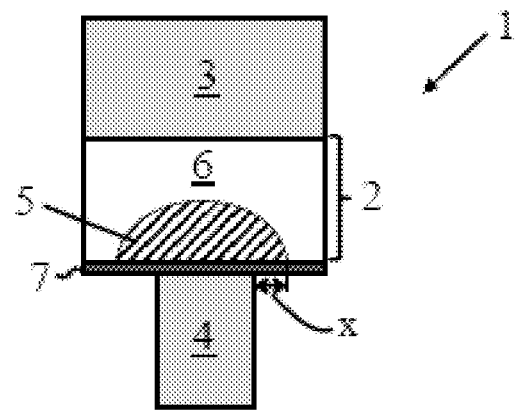
FIG. 1 shows a PCM cell from the prior art.
Figure 2:
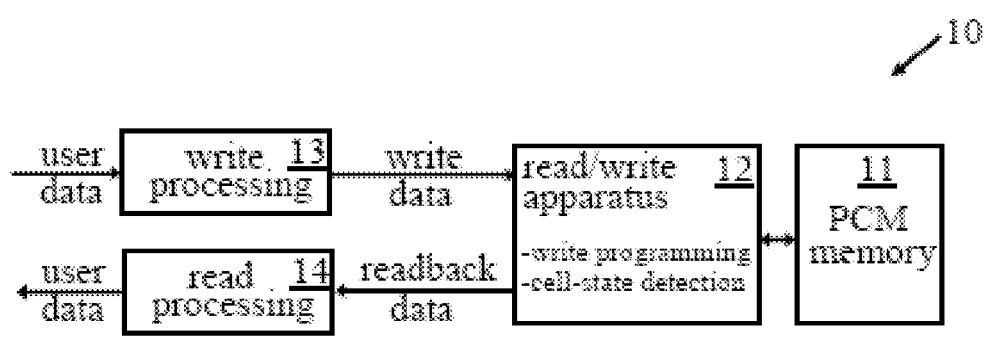
FIG. 2 is a schematic block diagram of a memory device, according to an embodiment of the present invention.

FIG. 2 is a simplified schematic of a phase-change memory device, according to an embodiment of the present invention. Device 10 includes multilevel phase-change memory 11 for storing data in one or more integrated arrays of PCM cells described below. Reading and writing of data to memory 11 is performed by a read/write controller 12. Controller 12 includes circuitry of generally known form for programming PCM cells during data write operations and making read measurements for detecting cell-state during data read operations. During these operations, the read/write controller can address individual PCM cells by applying appropriate control signals to an array of word and bit lines in memory ensemble 11. As indicated by block 13 in the figure, user data input to device 10 is typically subjected to some form of write-processing, such as coding for error-correction purposes, before being supplied as write data to controller 12. Similarly, read-back data output by controller 12 is generally processed by a read-processing module 14, e.g. for codeword detection and/or error correction, to recover the original input user data.

The PCM cells of memory 11 can store information in s>2 programmable cell states, providing multilevel operation. As discussed earlier, the s programmable cell-states correspond to different relative proportions of the amorphous and crystalline phases within the PCM material of the cell. These states include a high-resistance, fully-amorphous RESET state, a low-resistance, fully-crystalline SET state, and a number of intermediate states corresponding to increasing size of the amorphous phase within the otherwise crystalline PCM material. The s programmable cell-states are typically defined in controller 12 in terms of predetermined reference values, or ranges of values, of the resistance metric used for read detection. To program a cell in a write operation, controller 12 applies a voltage to the cell via the word- and bit-lines such that the resulting programming signal sets the cell to the required state. In a read operation, a (lower) read voltage is applied to the cell and the resulting cell current is measured to obtain the resistance metric. Controller 12 can then detect the programmed cell state by comparing the read metric with the aforementioned reference values.

Figure 3:
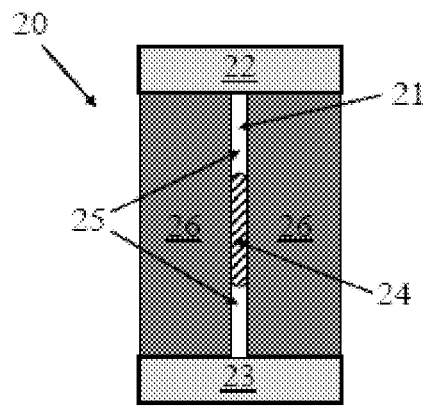
FIG. 3 shows a first PCM cell, according to an embodiment of the present invention.

FIG. 3 is a schematic cross-sectional view of a first PCM cell, according to an embodiment of the present invention. PCM cell 20 has a phase-change material 21 located between first and second electrodes, 22 and 23, for connecting the cell to the word and bit lines respectively of the cell array. (Such electrodes can be referred to herein as a "top" electrode and a "bottom" electrode, according to their arrangement in the figures, though no limitation is implied as to cell orientation in operation). Phase-change material 21 is shown in the figure containing an amorphous phase, indicated by region 24, and a crystalline phase, indicated by regions 25. The relative proportions of these phases differ for the different programmable cell states as described earlier. Hence, the s programmable states of PCM cell 20 correspond to different sizes of amorphous section 24 of the PCM core. PCM cell 20 further includes an electrically-conductive component 26 in contact with phase-change material 21. As illustrated schematically in the partially cut-away view of FIG. 4, in an embodiment, electrically-conductive component 26 includes a layer of electrically-conductive material which extends from one electrode to the other and all around phase-change material 21. Phase-change material 21 forms an elongate core of material within electrically-conductive component 26 which itself forms a sheath around the phase-change material core. In this example, the sheath and core have a generally circular cross-section giving a cylindrical shape. In general, however, these elements can be formed with any desired cross-sectional shape. PCM cell 20 is typically surrounded by an insulating layer (not shown) for electric and thermal insulation of the cell.

Phase-change material 21 can typically have a thickness (here diameter) in the range of about 1 nm to 20 nm, and preferably about 1 nm to 10 nm. The electrically-conductive component 26 forming the sheath can typically have a thickness in the range of about 1 nm to 50 nm, more usually about 1 nm to 20 nm, and preferably about 1 nm to 15 nm. Illustrative dimensions for elements of PCM cell 20 are indicated, by way of example, in FIG. 4. Here, Phase-change material 21 has a diameter of about 7 nm and a length of about 35 nm. Electrically-conductive component 26 forming the sheath has a thickness of about 7.5 nm here. It can be seen that the volume of electrically-conductive component 26 is greater than that of phase-change material 21. The radial thickness of the component is approximately equal to, though slightly greater than, the diameter of phase-change material 21. In an exemplary implementation of PCM cell 20, phase-change material 21 can include GST, electrodes 22, 23 can be formed of TiN, and electrically-conductive component 26 can be formed of TaN. PCM cell 20 can be fabricated using well-known material processing methods for formation of the various elements of the cell. By way of example, the core (phase-change material) and sheath (electrically-conductive component) structure can be produced by a keyhole-transfer process as described in Raoux et al., IBM J. Res. & Dev. 52(4/5), 465 (2008), (see FIG. 6 thereof). In general, however, the materials and dimensions of phase-change material 21 and electrically-conductive component 26 are selected to satisfy particular requirements. Firstly, the arrangement is such that the volume of the electrically-conductive component is at least about half the volume of the phase-change material, and preferably greater than the volume of phase-change material. In addition, the arrangement is such that the resistance presented by electrically-conductive component 26 to a cell current produced by the read voltage for cells is less than that of amorphous phase 24, and greater than that of crystalline phase 25, of phase-change material 21 in any of the s programmed cell states defined for multilevel operation. As a consequence, electrically-conductive component 26 presents a lower-resistance current path to the cell read current than amorphous phase 24 in any programmed cell state. This current path through electrically-conductive component 26 has a length dependent on the size of amorphous phase 24.

Figure 5:
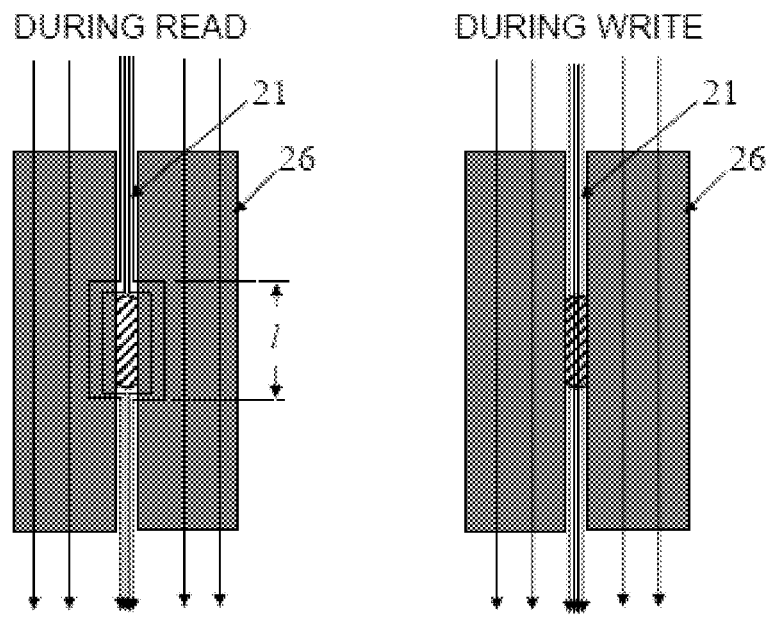
FIG. 5 indicates current flow in the FIG. 3 cell during read and write operations, according to an embodiment of the present invention.

FIG. 5 indicates current flow in PCM cell 20 during read and write operations, where current density is indicated schematically by spacing of the vertical arrows. Due to the resistance properties described above, in a read operation as indicated on the left of the figure, the cell current flows primarily through crystalline phase 25 of the core in preference to electrically-conductive component 26, and primarily through electrically-conductive component 26 in preference to the amorphous phase 24 of the core. The resulting current path through electrically-conductive component 26 has a length/ which is directly dependent on size of amorphous phase 24, increasing as the amorphous volume expands along the length of phase-change material 21. In a write operation, however, where a significantly higher voltage is applied between the cell electrodes, the cell current flows primarily through phase-change material 21 as indicated on the right of the figure. The resistive properties which provide these effects can be understood from a consideration of FIG. 6. This is a schematic illustration of the current/voltage (and hence resistance) characteristics of the material components of PCM cell 20. The solid lines indicate variation of current with voltage for phase-change material 21, starting from the fully-crystalline SET state (upper curve) and also the fully-amorphous RESET state (lower curve). These two curves reflect the large (typically 3 orders of magnitude) variation in resistivity between the crystalline and amorphous phases. The broken line in the plot indicates the (here ohmic) characteristic for electrically-conductive component 26. It can be seen that, at low voltages including the cell read voltage, the resistance of electrically-conductive component 26 is between that of the amorphous and crystalline phases of phase-change material 21. The resulting current flow during a read operation is thus as indicated in FIG. 5. The amorphous phase exhibits a non-linear characteristic with a threshold switching phenomenon that is field induced. At a certain threshold voltage $V_{TH}$, this phase switches to a very low "ON-state" resistance corresponding to that of the crystalline phase-change material. The cell programming (write) voltage is selected to be above this threshold voltage as indicated. At this voltage, the ON-resistance of phase-change material 21 is much less than that of electrically-conductive component 26. The write-current is thus substantially unaffected by presence of electrically-conductive component 26 as indicated in FIG. 5.

Based on the above principles, preferred cell arrangements are such that, at the cell read voltage, the resistance $R_{ec}$ of the electrically-conductive component is far from both the resistance $R_{amo}$ of the fully-amorphous (RESET) state, and also the resistance $R_{cry}$ of the fully-crystalline SET state, of the phase-change material (where "far" here means far within the context of the resistance range from $R_{cry}$ to $R_{amo}$). In general, an appropriate value for $R_{ec}$ in this range will depend on various factors such as the materials and dimensions of cell components, the particular characteristics of the s programmable cell states, the operating parameters (e.g. read and write voltages) of memory device 1 as well as desired performance criteria such as maximum acceptable error-rate. In general, however, the arrangement is preferably such that $R_{ec} \gg R_{cry}$ and $R_{ec} \ll R_{amo}$ within the context of the aforementioned range.

Due to the resistance characteristics described above, the effect of resistance drift in the amorphous phase on cell read operations is significantly reduced. This is because the cell current flows mainly through crystalline phase 25 and electrically-conductive component 26 which do not exhibit drift. Electrically-conductive component 26 provides a full parallel current path between electrodes 22, 23, avoiding the problem of plugging and providing drift-resistant operation regardless of amorphous size. Moreover, any residual drift effect (due to the very small current flowing through amorphous phase 24) will exhibit low variability between different cell states since the full parallel current path ensures that current through electrically-conductive component 26 will always dominate. In effect, the programmed state of PCM cell 20 can be considered to be projected onto the resistance of electrically-conductive component 26 in a read operation, as the length/of the current path through the electrically-conductive component reflects the amorphous size and hence the programmed state. The resistance information is thus effectively stored in electrically-conductive component 26 and resistance of the phase-change material is no longer used to differentiate cell states. In effect, therefore, the arrangement provides full decoupling of the phase-change operation and the information storage/readout task.

The design of PCM cell 20 also allows the programming volume of phase-change material to be significantly reduced without compromising overall resistance of the PCM cell. In general, the volume of phase-change material can be arbitrarily small, while the phase change resistance can be made arbitrarily large. In particular, the resistivity of the phase-change material can be increased to achieve a lower RESET current and reduce power consumption. In addition, noise associated with resistance of the phase-change material can be heavily masked by the electrically-conductive component. Moreover, encapsulation of the phase-change material in electrically-conductive component 26 offers reduced "thermal disturb" between neighboring cells in memory arrays. The electrically-conductive component provides a thermal barrier and heat sync, and the presence of the electrically-conductive component coupled with reduced phase-change volume allows adequate distance to be maintained between PCM elements even with much smaller cell-spacing.

Figure 7:
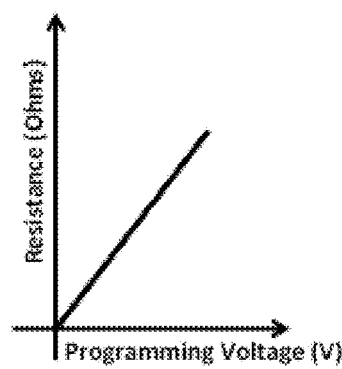
FIG. 7 shows a programming curve for the FIG. 3 cell, according to an embodiment of the present invention.

FIG. 7 indicates variation of cell resistance with programming voltage for the above cell assuming that electrically-conductive component 26 is of uniform resistivity. As amorphous size increases with increasing programming voltage, the resulting cell resistance increases accordingly, giving the linear programming curve shown. In other PCM cells embodying the invention, however, the resistance per unit length of the electrically-conductive component is not uniform, but varies along the direction of the aforementioned current path so as to provide a desired cell operating characteristic. A first such PCM cell will now be described with reference to FIGS. 8 to 10.

Figure 8:
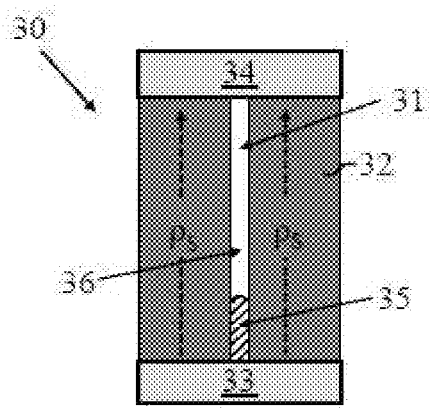
FIG. 8 illustrates a second PCM cell, according to an embodiment of the present invention.
Figure 9:
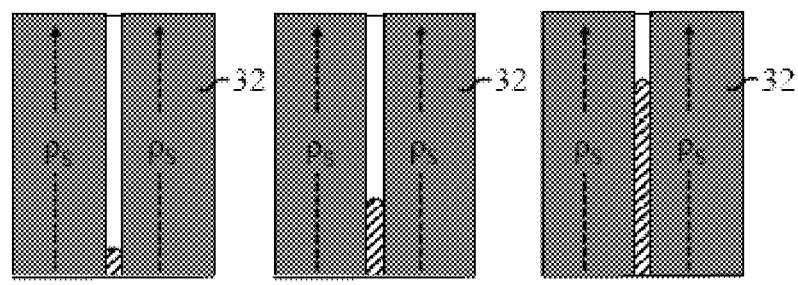
FIG. 9 shows increasing amorphous size in the FIG. 8 cell, according to an embodiment of the present invention.

FIG. 8 is a schematic cross-sectional view of a second PCM cell 30, according to an embodiment of the present invention. PCM cell 30 is broadly similar to PCM cell 20 of FIG. 3, having a phase-change material 31 within an electrically-conductive component 32 which extends from a bottom electrode 33 to a top electrode 34. Whereas, in FIG. 3, the amorphous phase forms in a middle region of the phase-change material and expands towards both electrodes, in PCM cell 30 the phase configuration in the phase-change material varies as indicated in FIG. 9. Amorphous phase 35 forms initially above bottom electrode 33 and increases in size towards top electrode 34 for successively higher-resistance programmed cell states. The thermal system of PCM cell 30 is thus designed so that the "hot-spot" is located just above bottom electrode 33. This can be achieved by appropriate thermal engineering of the cell, e.g. by selecting suitable parameters such as the relative size, arrangement, thickness, and thermal conductivity of the electrodes, as will be readily apparent to those skilled in the art.

Figure 6:
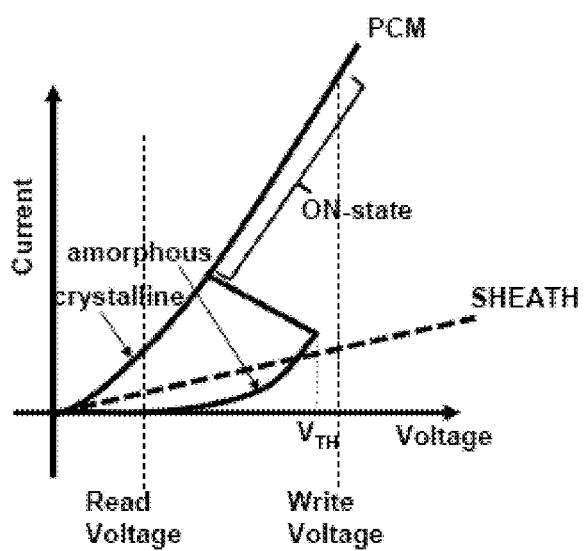
FIG. 6 indicates resistive properties of elements of the FIG. 3 cell, according to an embodiment of the present invention.

The resistive properties of elements of PCM cell 30 conform to the basic requirements discussed above for PCM cell 20, whereby operation of PCM cell 30 is broadly as described with reference to FIGS. 5 and 6. In PCM cell 30; however, the resistivity $\rho_S$ of the material forming electrically-conductive component 32 varies over the length of the electrically-conductive component, increasing generally monotonically from bottom electrode 33 towards top electrode 34 as indicated by the arrow in the figure. As a result, the resistance per unit length of electrically-conductive component 32 varies in the direction of the current path (as indicated in FIG. 5) through the electrically-conductive material. Specifically, the resistance per unit length increases in the direction of increasing length of the current path corresponding to increasing amorphous size. The effect of this variation in resistance per unit length is to modify the programming curve as indicated in FIG. 10. Compared to the linear relation of FIG. 7, a higher-resistance state is achieved for a given programming voltage, the resistance difference increasing with increasing programming voltage. In effect, therefore, the cell resistance for the higher programmed cell states is increased, enhancing the overall resistance contrast and providing increased programming range. This effectively increases the programming space available for resistance levels corresponding to different cell states, facilitating discrimination of different cell states on readback and/or permitting storage of more levels per cell.

Figure 4:
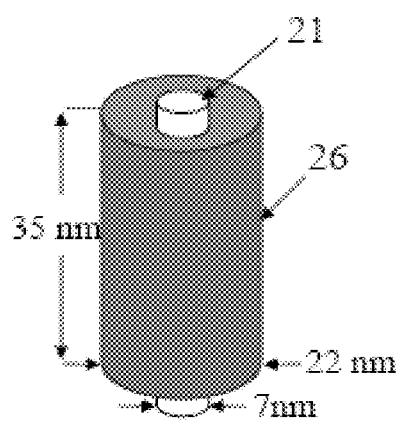
FIG. 4 illustrates part of the FIG. 3 cell structure, according to an embodiment of the present invention.

The particular values and variation of the resistivity $\rho_S$ can be selected as required in a given cell structure to achieve a desired operational characteristic, e.g. a desired programming range, and/or desired resistance values for particular programmed cell states, and/or a programming curve of a desired shape. Appropriate values and ranges will depend on various factors such as the particular materials and dimensions of elements of the cell structure, desired characteristics of the s programmable cell states, the operating parameters (e.g. read and write voltages) of memory device 1 as well as desired performance criteria such as maximum acceptable error-rate. Appropriate parameters in a given scenario will be readily apparent to those skilled in the art. In some embodiments, the resistivity $\rho_S$ of the electrically-conductive material can vary from a value close to that of the amorphous phase at bottom electrode 33 to a value close to that of the crystalline phase at top electrode 33 (subject to the general resistance requirements described earlier). The term "close" here means close within the context of the range (typically spanning several orders of magnitude) from the resistivity $\rho_C$ of the crystalline phase-change material to the resistivity $\rho_A$ of the amorphous phase-change material. As one illustrative example, for a cell 30 having a GST core 31 and TaN sheath 32 with dimensions as indicated in FIG. 4, the resistivity $\rho_A$ of the amorphous GST can be about 0.1 Ωm, the resistivity $\rho_C$ of the crystalline GST can be about 0.0001 Ωm, and the resistivity $\rho_S$ of the electrically-conductive material can vary from about 0.1 Ωm (i.e. approximately equal to $\rho_A$) to about 0.001 Ωm (i.e. approximately an order of magnitude from $\rho_C$).

PCM cell 30 can be fabricated using standard processing methods to form the various cell elements. Conveniently, the PCM sheath can be used to lithographically define the PCM element during fabrication. A simple example of such a method is illustrated in FIGS. 11a to 11d. Here, bottom electrode 33 is first formed on insulating substrate 38 using standard deposition and lithography methods. Next, a layer of TaN is deposited on bottom electrode 33 as indicated in FIG. 11b. During the deposition process, the resistivity of the TaN layer can be gradually increased, for example, by increasing the flow rate of nitrogen gas over the structure. Next, the core area is removed from the TaN layer, e.g. by etching, to give the structure of FIG. 11c. The TaN sheath then provides the pattern for forming the GST core 31 in a subsequent deposition step, followed by formation of the top electrode to give the structure of FIG. 11*d*.

Figure 12:
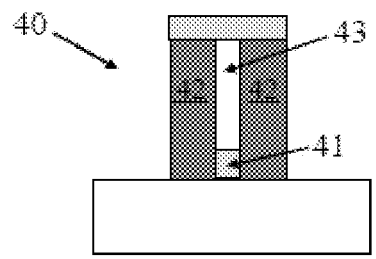
FIG. 12 shows an electrode arrangement for the FIG. 8 cell, according to an embodiment of the present invention.

While an example is given above, in general the various elements of PCM cell 30 can be formed in any desired manner, and in any convenient order, to give the required arrangement. Suitable processes and methods will be readily apparent to those skilled in the art. In an alternative embodiment, for instance, electrically-conductive component 26 can be formed of a doped semiconductor material, e.g. doped silicon, and the resistivity variation can be achieved by varying the doping level during deposition. The increase in electrically-conductive component resistivity with length can be substantially continuous, or can be graduated in some embodiments. Moreover, similar principles can be applied in cells, such as PCM cell 20 of FIG. 3, where the amorphous phase increases in size from a middle section of the core. In such cases, the resistance per unit length of the electrically-conductive component can increase in two directions, i.e. from a central region of the component towards both the top and bottom electrodes, corresponding to expansion of the amorphous volume. A further modification is illustrated in FIG. 12. Here the cell structure corresponds generally to that of FIG. 8, but bottom electrode 41 is confined within electrically-conductive component 42 to the lateral dimensions of phase-change material 43. This arrangement facilitates formation of the hot-spot above bottom electrode 41 due to its reduced size and thus localized heating effect. Fabrication is also simplified since the electrically-conductive component can be formed directly on the insulating substrate and used for patterning of both the bottom electrode and the phase-change material core.

Figure 13:
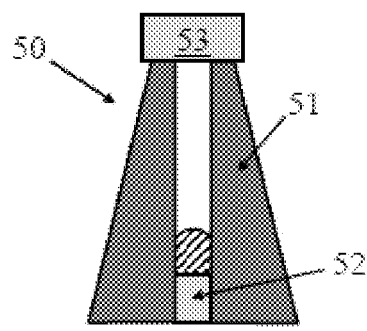
FIG. 13 illustrates a third PCM cell, according to an embodiment of the present invention.

FIG. 13 is a schematic cross-sectional view of a third PCM cell, according to an embodiment of the present invention. This PCM cell 50 is adapted to operate generally as PCM cell 30 above and only the key differences are discussed in the following. In PCM cell 50, the diameter of electrically-conductive component 51 decreases in a direction from bottom electrode 52 to top electrode 53. The resistivity $\rho_S$ of the electrically-conductive component is substantially uniform in this example. However, the decreasing electrically-conductive component diameter causes the resistance per unit length of the component to increase with increasing length of the current path through the electrically-conductive component. Thus, the shape variation results in similar modification of the programming curve as the resistivity variation in PCM cell 30. As before, the particular geometric and material parameters in this embodiment can be selected to provide a desired cell characteristic. By way of example, however, for a phase-change material core diameter of about 7 nm and length 35 nm, with $\rho_A$ of about 0.1 $\Omega$m and $\rho_C$ of about 0.0001 $\Omega$m, the outer diameter of electrically-conductive component 51 can decrease from about 22 nm at the bottom electrode to about 8 nm at the top electrode, with a component resistivity $\rho_S$ of about 0.02 $\Omega$m.

Other electrically-conductive component shapes and shape-variations can of course be envisaged, e.g. a step-wise variation or a bi-directional variation for a centrally-disposed hot-spot, and a combination of shape and resistivity modulation can be employed if desired. The required shape of the electrically-conductive component can be produced in any convenient manner, for example by using appropriately shaped spacers during deposition of the electrically-conductive component material.

Figure 14:
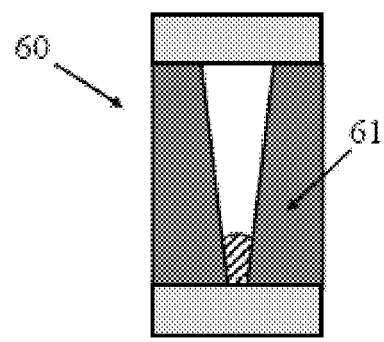
FIG. 14 illustrates a fourth PCM cell, according to an embodiment of the present invention.

An alternative cell design, which is based on the same principles as PCM cell 50 and is particularly easy to fabricate, is illustrated in FIG. 14. In this PCM cell 60, the shape variation is achieved by increasing the inner diameter of electrically-conductive component 61. The outer component diameter remains constant. This structure can be readily achieved using a removable spacer, or former, to define the core region during deposition of the electrically-conductive material. After removal of the spacer, the resulting bore in the electrically-conductive component defines the pattern for formation of the core on subsequent deposition of the phase-change material. In this embodiment, therefore, the core thickness (here diameter) increases in the direction in which the electrically-conductive component thickness decreases. However, operation is substantially the same as in the above embodiment where the core diameter is substantially uniform along its length.

Figure 15:
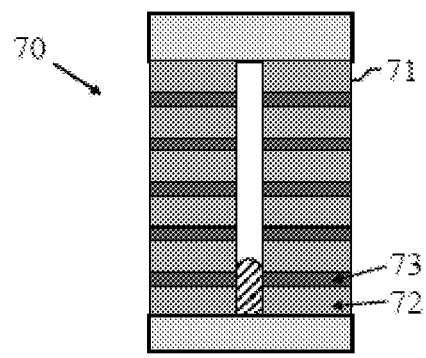
FIG. 15 illustrates a fifth PCM cell, according to an embodiment of the present invention.

FIG. 15 is a schematic cross-sectional view of another PCM cell, according to an embodiment the present invention. This PCM cell 70 again conforms to the general operating principles discussed above, and only the key differences will be described below. In this design, electrically-conductive component 71 includes alternating first and second sections, 72 and 73 respectively, in the direction of the current path though the electrically-conductive component. First sections 72 are of lower resistance than second sections 73. According to an embodiment, second sections 73 are of smaller thickness than first sections 72. First sections 72 also have a lower resistivity $\rho_{S1}$ than the resistivity $\rho_{S2}$ of second sections 73.

Figure 16:
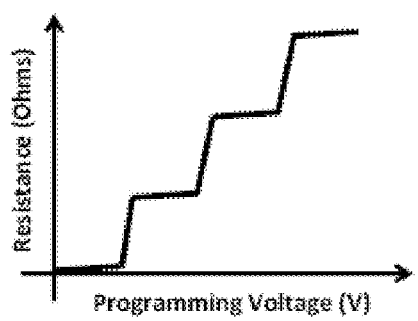
FIG. 16 shows a programming curve for the FIG. 15 cell, according to an embodiment of the present invention.

FIG. 16 indicates the effect on the programming curve of this modulation in the resistance per unit length of electrically-conductive component 71. The curve has a stepped shape, with the steeper sections corresponding to respective higher-resistance layers 73 and the flatter sections corresponding to lower-resistance layers 72. This type of stepped programming curve provides an excellent mechanism for defining, and differentiating, multiple cell levels corresponding to different programmable states. The steps can be adapted such that each step, and specifically the flat, top section of the step, corresponds to a respective programmable cell state. The measured cell resistance varies little over the range of programming voltages corresponding to this section, giving well-defined resistance levels for each cell state. In addition, the resistance levels corresponding to different cell states are well separated due to the steep side-sections of the steps. This cell design thus provides an elegantly simple mechanism for clearly differentiating different programmed cell states. This both facilitates read detection and offers fast, accurate write programming. In particular, such multilevel cells are especially amenable to so-called "single-shot programming", whereby a required cell-state is achieved using a single programming pulse. This contrasts with the more-common, iterative programming method which uses a series of programming pulses, with intervening read operations, to gradually converge on the required state.

Subject to the general resistance requirements described earlier, first sections 72 preferably have a resistivity close to the resistivity $\rho_C$ of the crystalline phase of the phase-change core material, and second sections 73 preferably have a resistivity close to the resistivity $\rho_A$ of the amorphous PCM material, in order to enhance the stepped structure of the programming curve. (Again, the term "close" here should be construed in the context of the large resistivity range from $\rho_C$ to $\rho_A$). If second sections 73 are of sufficiently small thickness, the resistivity of these sections can be sufficiently close as to be approximately equal to $\rho_A$. As one illustrative example, for a PCM cell 70 having a GST core and TaN electrically-conductive component 71 with the dimensions indicated in FIG. 4: the layer structure can be a regular periodic structure; the thickness of first layers 72 can be in a range of about 5 to 10 nm; the thickness of second layers 73 can be in a range of about 1 to 5 nm; the resistivity $\rho_A$ can be about 0.1 Ωm; the resistivity $\rho_C$ can be about 0.0001 Ωm; the resistivity $\rho_{S1}$ of the first sections can be about 0.001 Ωm; and the resistivity $\rho_{S2}$ of the second sections can be about 0.1 Ωm.

PCM cell 70 can be fabricated generally as described earlier, varying the resistivity of the electrically-conductive material layer-by-layer during deposition, and the various materials, dimensions and other parameters can be selected as required to give a desired shape to the programming curve. Various modifications to this design can also be envisaged. For example, the layer structure, and resulting steps of the programming curve, can not be entirely regular but can be adapted to particular requirements for different programming states. A similar resistivity modulation can also be achieved by modulating the thickness of the electrically-conductive component, or via a combination of shape and resistivity variation.

It will be seen that, by varying the resistance per unit length of the electrically-conductive component as described, the above embodiments offer highly efficient PCM cells with significantly improved operating characteristics.

Numerous modifications to the above embodiments can be envisaged. The principles explained above relating to arrangement, volume and resistive characteristics of the phase-change and electrically-conductive components afford superior design flexibility for PCM cells, permitting reduction of dimensions and optimization of parameters to achieve various efficient cell designs. In general, the PCM element can take other forms than an elongate core and can have a variety of cross-sectional shapes. The electrically-conductive component can not extend fully around PCM element in some embodiments. Embodiments can also be envisaged in which the electrically-conductive component does not provide a full parallel current path between the electrodes, but extends only part-way between the electrodes.

Figure 17:
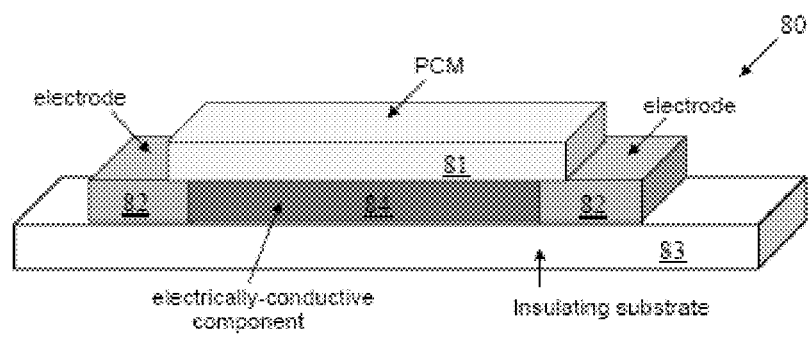
FIG. 17 shows a sixth PCM cell, according to an embodiment of the present invention.

FIG. 17 illustrates another example of a highly advantageous cell design employing the principles described above. In this "lateral" design, PCM cell 80 has a layer 81 of PCM material. PCM layer 81 extends between two electrodes implemented by layers 82 formed on an insulating substrate 83. The electrically-conductive component is formed by a layer of electrically-conductive material 84 formed on substrate 83 and extending from one electrode 82 to the other. Electrically-conductive layer 84 is in contact with the lower surface of the overlying PCM layer 81. Conductive layer 84 has a volume greater than half that of PCM layer 81. Here the volume of conductive layer 84 is similar to that of PCM layer 81. The thickness of conductive layer 84 is approximately equal to, or greater than, that of PCM layer in this example. By way of illustration, PCM layer 61 can be formed of GST to a thickness of about 1 nm to 100 nm, and preferably about 1 to 10 nm. The electrically conductive layer 64 can be formed, for example, of TaN. This layer can have a thickness in the range of about 1 nm to 100 nm, and preferably about 1 to 20 nm. Electrodes 62 can be formed of TiN.

Figure 18:
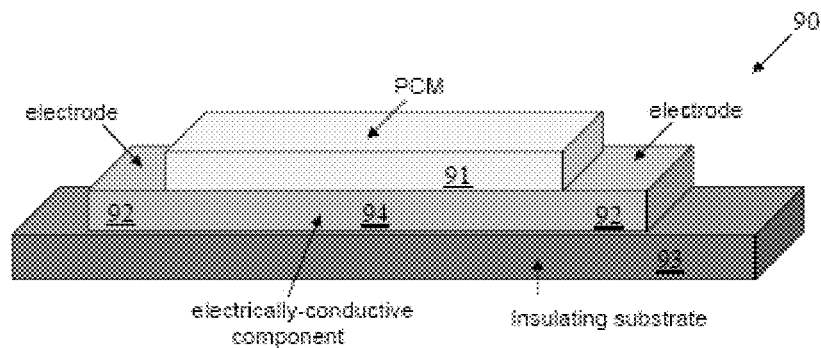
FIG. 18 illustrates a seventh PCM cell, according to an embodiment of the present invention.

Such lateral cell designs involving deposition/patterning of material layers are particularly simple to fabricate using standard material processing methods. Filling of high-aspect-ratio trenches is not required, and dimensions can be easily adjusted, e.g. to achieve very small PCM volume or other desired properties. A further simplification of the lateral cell structure is illustrated in FIG. 18 and exploits the fact that the electrically-conductive component can be formed of the same material as electrodes in cells embodying the invention. In the cell 90 of FIG. 18, the electrodes 92 are integrally formed with the electrically-conductive component 94 as a single layer of electrically-conductive material on substrate 93.

The resistance per unit length of the current path along conductive layer 84, 94 in FIGS. 17 and 18 can be varied in a similar manner to the earlier embodiments, thereby providing a desired cell characteristic. Hence, the resistivity of the material can be varied in a direction between the electrodes, and/or the shape of the layer can be varied in this direction. For example, though shown as rectangular layers in the figure, the width (into the page) of conductive layer 84, 94 and PCM layer 81, 91 can decrease from one electrode towards the other to achieve operation similar to PCM cell 50 above. Alternatively, for example, the structure can include alternating sections of higher and lower width or resistivity in a direction between the electrodes to achieve operation similar to PCM cell 70 above. Again, various modifications can be envisaged, e.g. as discussed for earlier embodiments.

Figure 19:
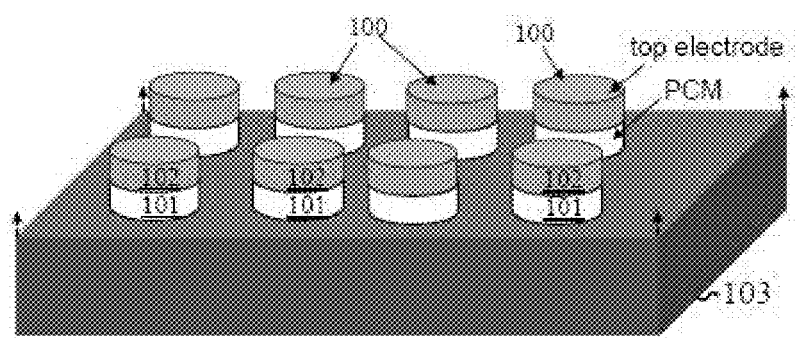
FIG. 19 indicates structure of an array of PCM cells, according to an embodiment of the present invention.

Lateral cell designs offer particularly simple fabrication of memory cell arrays. For example, an array structure based on lateral cells is illustrated schematically in FIG. 19. This is a partially cut-away perspective view of part of an array of cells 100. Each cell 100 has a layer of PCM material 101 beneath a top electrode layer 102. Layers 101 and 102 of cells 100 are embedded in a matrix of electrically-conductive material 103. This matrix provides both the bottom electrode for each cell and also the electrically-conductive component of each cell. Although shown cut-away in this figure, matrix 103 extends up sides of cells 100 to contact top electrode 101 of each cell. The resistivity of this matrix can be varied along a direction towards top electrodes 102 to provide a variation in resistance per unit length as described above. As will be apparent to those skilled in the art, individual cells can be isolated for addressing purposes by any convenient mechanism, e.g. using access devices associated with respective cells which are connected between the word and bit lines of the array.

A phase-change memory cell for storing information in a plurality of programmable cell states is provided. The memory cell includes: a phase-change material located between first and second electrodes for applying a read voltage to the phase-change material to read the programmed cell state; and an electrically-conductive component extending in a direction between the electrodes in contact with the phase-change material and arranged to present, to a cell current produced by the read voltage, a lower-resistance current path than the amorphous phase of the phase-change material in any of said cell states, said current path having a length dependent on size of said amorphous phase; wherein the volume of the electrically-conductive component is greater than about half that of said phase-change material.

In PCM cells, according to an embodiment of the present invention, the electrically-conductive component extends, in contact with the phase-change material, in a direction between the electrodes and has a volume greater than about half the volume of the phase-change material. In addition, the electrically-conductive component presents a lower-resistance path than the amorphous phase to the cell read current, and is arranged such that the length of this current path depends on amorphous size and thus cell state. The cell current will flow primarily via the lower-resistance current path through the electrically-conductive component in preference to flowing through the amorphous phase. Cell resistance, and hence measured cell state, thus depends primarily on resistance of the variable-length current path through the electrically-conductive component, mitigating the effect on read measurements of resistance drift in the amorphous phase. The foregoing features also offer significant benefits for cell design, providing greater design flexibility, allowing cell dimensions to be reduced, and permitting realization of highly efficient cell designs as exemplified below. The volume of phase-change material can be significantly reduced compared to prior designs, while still providing highly efficient cell operation. The electrically-conductive component can ensure that the overall resistance of the PCM cell does not increase dramatically as the programmed volume is scaled down. The reduced volume of phase-change material coupled with significant volume of the electrically-conductive component can also offer improvements in relation to shielding and thermal disturb. Embodiments of the invention thus offer extremely valuable improvements in phase-change memory devices.

In general, the volume of the electrically-conductive component can be approximately equal to, or greater than, half the volume of phase-change material. According to an embodiment, however, the volume is approximately equal to, or greater than, the volume of the phase-change material, and is most preferably greater than the volume of phase-change material. For example, the thickness of the electrically-conductive component perpendicular to the direction between the electrodes can be greater than about half that of the phase-change material. Preferably this thickness is approximately equal to, or greater than, (and is most preferably greater than) the corresponding thickness of the phase-change material. (Note that the aforementioned thickness need not be constant over the extent of the electrically-conductive component (or phase-change material) between the electrodes. However, the thickness conditions can still apply substantially at any point over this extent.)

The electrically-conductive component can include a layer of electrically-conductive material. The particular arrangement and thickness of this layer can vary considerably between different cell designs. In a preferred embodiment, the electrically-conductive component forms a sheath around the phase-change material, and the phase-change material forms an elongate core within said sheath. According to an embodiment said core includes a nanowire of phase-change material. The sheath can be formed by a layer of electrically-conductive material extending substantially all the way around the phase-change material. Such arrangements permit efficient cell designs, with very small PCM volumes and/or high PCM resistance for reduced RESET current and hence low power consumption, as well as reduced thermal disturb due to shielding by the sheath.

According to an embodiment of the present invention, the cell includes a layer of said phase-change material. The layer of electrically-conductive material can be disposed on (at least) one surface of the layer of phase-change material. Such layer structures provide the basis for highly efficient cell designs which are particularly easy to fabricate.

The electrically-conductive component can be formed of the same material as at least one of the electrodes. Moreover, at least one of the electrodes can be integrally formed with the electrically-conductive component. These features can facilitate fabrication and offer especially simple cell designs.

In some embodiments, the phase-change material can be embedded in a matrix of the electrically-conductive material which provides said component. This again can offer various advantages including shielding and ease of fabrication, permitting particularly simple construction of memory cell arrays.

According to an embodiment of the present invention, the resistance presented by the component to the read current is greater than that of the crystalline phase of the phase-change material in any of the s cell states. Therefore, the resistance presented by the component to the read current is less than that of the amorphous phase, and greater than that of the crystalline phase, of the phase-change material in any of the s cell states. The electrically-conductive component can extend from one electrode to the other in contact with the phase-change material, providing a full parallel current path between the electrodes. Cell current will flow primarily through the crystalline phase in preference to the electrically-conductive component, and primarily through the electrically-conductive component in preference to the amorphous phase. Such an embodiment provides full decoupling of the phase-change operation and the information storage/readout task as discussed further below. Furthermore, drift-resistant operation is available regardless of amorphous size.

In a particularly advantageous embodiment, the resistance per unit length of the component in the direction of said current path is not constant, but varies so as to provide a desired cell operating characteristic. The resistance of the current path thus varies in a non-linear manner with length of the current path, and hence with amorphous size, and this variation is adapted to provide a desired characteristic in operation of the cell. Varying the resistance per unit length can produce a variety of effects on cell operation, and this can be exploited to achieve a required operating characteristic. Such effects include increasing the resistance contrast and programming range to desired values, tuning the resistive properties of the various cell states, or of any particular cell state, and generally adjusting the current/voltage characteristic of the cell to achieve a programming curve of a desired shape. Cell operating characteristics can thus be adapted as required, e.g. to conform to particular operating parameters, reduce power consumption, facilitate read and/or write operations, or otherwise improve cell performance. Such cells can thus offer significant advantages for phase-change memory devices.

The shape and/or resistivity of the electrically-conductive component can vary in the direction of said current path to produce the variation in resistance per unit length of the component. According to an embodiment, the resistance per unit length increases in a direction in which the length of the current path increases with amorphous size. This increases the cell resistance for the higher-resistance cell states corresponding to larger amorphous size. This, in turn, increases resistance contrast and offers increased programming range, facilitating discrimination of different cell states and/or permitting storage of more levels per cell.

In an embodiment of the invention, the electrically-conductive component includes alternating first and second sections in the direction of said current path, the first sections being of lower resistance than the second sections, to provide a stepped programming curve for the memory cell. This provides an elegantly simple mechanism for clearly differentiating the different programmed cell states, facilitating read detection and offering fast, accurate write programming. In particularly simple implementations of this design, the resistance variation is achieved by modulating resistivity. Thus, the first sections of the electrically-conductive component can have lower resistivity than the second sections.

According to an embodiment of a second aspect of the invention, a memory device including an array of phase-change memory cells according to the first aspect of the invention, and a read/write controller for reading and writing data in the memory cells.

According to an embodiment of a third aspect of the invention, a method for forming a phase-change memory cell for storing information in a plurality of programmable cell states is provided. The method includes: forming first and second electrodes having a phase-change material located there between; and forming an electrically-conductive component having a volume which is greater than about half that of said phase-change material; the method being performed such that said component extends in a direction between the electrodes in contact with the phase-change material and is arranged to present, to a cell current produced by a read voltage applied via the electrodes to read the programmed cell state in use, a lower-resistance current path than the amorphous phase of the phase-change material in any of said cell states, said current path having a length dependent on size of said amorphous phase.

The method can include forming the electrically-conductive component such that the resistance per unit length of the component varies in the direction of said current path, thereby to provide a desired cell operating characteristic.

In general, where features are described herein with reference to an embodiment of one aspect of the invention, corresponding features can be provided in embodiments of another aspect of the invention.

While particular examples have been given for illustrative purposes above, any materials and dimensions giving the required properties and resistance characteristics can be selected for the various elements of PCM cells embodying the invention. Alternative phase change materials include other compounds of some or all elements Ge, Sb and Te, such as $Ge_2Sb_2Te_5$, GeTe, and $Ge_{15}Sb_{85}$ for example. Such compounds can also have added constituents such as carbon, nitrogen, silicon, or silicon dioxide for instance. Other possible materials include In—Ge—Te alloys, Si—Sb—Te alloys and Si—Sb alloys. One can also foresee the use of phase change nanowires in the fabrication of such memory cells. In general, the electrically-conductive component can be formed of any suitable material. Examples of such materials include metal nitrides such as TiN, TiAlN, TaN, BN, metal oxide nitrides such as TiON, metal silicides such as PtSi, semiconductors such as silicon or germanium (with and without doping), reduced metal oxides such as TiOx (x<2 indicates reduction), metals such as W, Ni, Co, or carbon based materials. The electrodes can be formed of any convenient electrically-conductive material, typically a metallic material (e.g. a pure metal or a metal compound, alloy or other mixture) or a doped semiconductor material such as silicon. Moreover, while the features described are particularly advantageous for multi-level cells, these features can also be applied to advantage in single-level cells in some embodiments.

Many other changes and modifications can be made to the exemplary embodiments described without departing from the scope of the invention.

What is claimed is:

1. A phase-change memory cell for storing information in a plurality of programmable cell states, the memory cell comprising:
   a phase-change material located between a first electrode and a second electrode for applying a read voltage to the phase-change material to read a programmed cell state; and
   an electrically-conductive component extending in a direction between the first and second electrodes in contact with the phase-change material and arranged to present, to a cell current produced by the read voltage, a lower-resistance current path than an amorphous phase of the phase-change material in any of the plurality of programmable cell states, said current path having a length dependent on a size of said amorphous phase, wherein the electrically-conductive component forms a sheath around the phase-change material, and the phase-change material forms an elongate core within said sheath, wherein a volume of the electrically-conductive component is greater than about half that of said phase-change material.

2. The memory cell as claimed in claim 1, wherein the volume of the electrically-conductive component is greater than the volume of said phase-change material.

3. The memory cell as claimed in claim 1, wherein a thickness, perpendicular to said direction, of the electrically-conductive component is greater than half that of said phase-change material.

4. The memory cell as claimed in claim 3, wherein the thickness, perpendicular to said direction, of the electrically-conductive component is greater than that of said phase-change material.

5. The memory cell as claimed in claim 1, wherein said electrically-conductive component comprises a layer of electrically-conductive material.

6. The memory cell as claimed in claim 5, wherein said layer of electrically-conductive material has a thickness in the range of 1 nm to 20 nm.

7. The memory cell as claimed in claim 1, wherein the elongate core includes a nanowire of phase-change material.

8. The memory cell as claimed in claim 7, wherein said elongate core has a thickness in the range of 1 nm to 10 nm.

9. The memory cell as claimed in claim 8, wherein said sheath has a thickness in the range of 1 nm to 15 nm.

10. The memory cell as claimed in claim 5, including a layer of said phase-change material, wherein said layer of electrically-conductive material is disposed on one surface of the layer of phase-change material.

11. The memory cell as claimed in claim 1, wherein the electrically-conductive component is formed of the same material as at least one of the first and second electrodes.

12. The memory cell as claimed in claim 11, wherein at least one of the first and second electrodes is integrally formed with the electrically-conductive component.

13. The memory cell as claimed in claim 12, wherein the phase-change material is embedded in a matrix of electrically-conductive material providing said electrically-conductive component.

14. The memory cell as claimed in claim 1, wherein a resistance presented to said cell current by the electrically-conductive component is greater than that of a crystalline phase of said phase-change material in any of said plurality of programmable cell states.

15. The memory cell as claimed in claim 1, wherein information is stored in s>2 programmable cell states.

16. The memory cell as claimed in claim 15, wherein a resistance per unit length of said electrically-conductive component varies in the direction of said current path, thereby to provide a desired cell operating characteristic.

17. The memory cell as claimed in claim 16, wherein a shape of said electrically-conductive component varies in the direction of said current path to vary the resistance per unit length.

18. The memory cell as claimed in claim 7, wherein a thickness of said elongated core increases in a direction in which the thickness of said sheath decreases.

19. The memory cell as claimed in claim 16, wherein a resistivity of said electrically-conductive component varies in the direction of said current path to vary the resistance per unit length.

20. The memory cell as claimed in claim 16, wherein the resistance per unit length of said electrically-conductive component increases in a direction in which the length of the current path increases with the size of said amorphous phase.

21. The memory cell as claimed in claim 16, wherein said electrically-conductive component comprises alternating first sections and second sections in the direction of said current path, the first sections being of lower resistance than the second sections, to provide a stepped programming curve for the memory cell.

22. The memory cell as claimed in claim 21, wherein the second sections have smaller thickness in the direction of said current path than the first sections.

23. The memory cell as claimed in claim 21, wherein the first sections have lower resistivity than the second sections.

24. The memory cell as claimed in claim 23, wherein the first sections have a resistivity close to that of a crystalline phase of the phase-change material.

25. The memory cell as claimed in claim 23, wherein the second sections have a resistivity close to that of the amorphous phase of the phase-change material.

26. The memory cell as claimed in claim 1, wherein said amorphous phase expands from the first electrode towards the second electrode in successive cell states.

27. The memory cell as claimed in claim 1, wherein said amorphous phase expands towards both the first and second electrodes in successive cell states.

28. A memory device comprising:
   an array of phase-change memory cells including:
      a phase-change material located between a first electrode and a second electrode for applying a read voltage to the phase-change material to read a programmed cell state; and
      an electrically-conductive component extending in a direction between the first and second electrodes in contact with the phase-change material and arranged to present, to a cell current produced by the read voltage, a lower-resistance current path than an amorphous phase of the phase-change material in any of the plurality of programmable cell states, said current path having a length dependent on a size of said amorphous phase, wherein the electrically-conductive component forms a sheath around the phase-change material, and the phase-change material forms an elongate core within said sheath,
      wherein a volume of the electrically-conductive component is greater than about half that of said phase-change material; and
      a read/write controller for reading and writing data in the phase-change memory cells.

29. A method for forming a phase-change memory cell for storing information in a plurality of programmable cell states, the method comprising:
   forming a first electrode and a second electrodes having a phase-change material located there between; and
   forming an electrically-conductive component having a volume which is greater than half that of said phase-change material, wherein the electrically-conductive component forms a sheath around the phase-change material, and the phase-change material forms an elongate core within said sheath,
   wherein said electrically-conductive component extends in a direction between the first and second electrodes in contact with the phase-change material and is arranged to present, to a cell current produced by a read voltage applied via the first and second electrodes to read a programmed cell state in use, a lower-resistance current path than an amorphous phase of the phase-change material in any of said plurality of programmable cell states, said current path having a length dependent on a size of said amorphous phase.

30. The method as claimed in claim 29, including forming said electrically-conductive component such that a resistance per unit length of the electrically-conductive component varies in a direction of said current path, thereby to provide a desired cell operating characteristic.

\* \* \* \* \*